United States Patent
Lee et al.

(10) Patent No.: US 7,924,645 B2
(45) Date of Patent: Apr. 12, 2011

(54) REFRESHING METHOD

(75) Inventors: Cheng-Sheng Lee, Hsinchu County (TW); Cheng-Fung Wu, Taipei County (TW)

(73) Assignee: Winbond Electronics Corp., Taichung County (TW)

( * ) Notice: Subject to any disclaimer, the term of this patent is extended or adjusted under 35 U.S.C. 154(b) by 136 days.

(21) Appl. No.: 12/366,916

(22) Filed: Feb. 6, 2009

(65) Prior Publication Data
US 2010/0202232 A1    Aug. 12, 2010

(51) Int. Cl.
*G11C 7/00* (2006.01)
(52) U.S. Cl. .... 365/222; 365/203; 365/229; 365/230.03
(58) Field of Classification Search .................. 365/203, 365/222, 229, 230.03
See application file for complete search history.

(56) References Cited

U.S. PATENT DOCUMENTS

| 2003/0103368 A1* | 6/2003 | Arimoto et al. ................. 365/63 |
| 2004/0145959 A1* | 7/2004 | Kuge et al. ............... 365/230.03 |
| 2005/0276134 A1* | 12/2005 | Mori et al. .................... 365/203 |
| 2007/0104005 A1* | 5/2007 | Bowyer et al. ................ 365/207 |

* cited by examiner

*Primary Examiner* — Hoai V Ho
(74) *Attorney, Agent, or Firm* — J.C. Patents (57) ABSTRACT

A refreshing method suitable for a memory device is provided which includes the following steps. A sleep mode is set and the memory device cannot be read and programmed in the sleep mode. A first and a second memory cell arrays are sequentially auto-refreshed, and the steps for auto-refreshing each of the first and the second memory cell arrays individually include: during an equalization period, switching the potential of a sense line pair, a first bit line pair and a second bit line pair to a reference voltage wherein the sense line pair is not coupled to the second bit line pair, and during a refreshing period, adjusting the potential of the first and the second bit line pairs according to a refresh sequence of the first and the second memory cell arrays, thereby coupling the sense line pair to one of the first and the second bit line pairs.

6 Claims, 6 Drawing Sheets

REFRESHING METHOD

BACKGROUND OF THE INVENTION

1. Field of the Invention

The present invention relates generally to a refreshing method for a memory device, and more particularly, to a refreshing method for a memory device which can reduce leakage current and noise.

2. Description of Related Art

Figure 1:
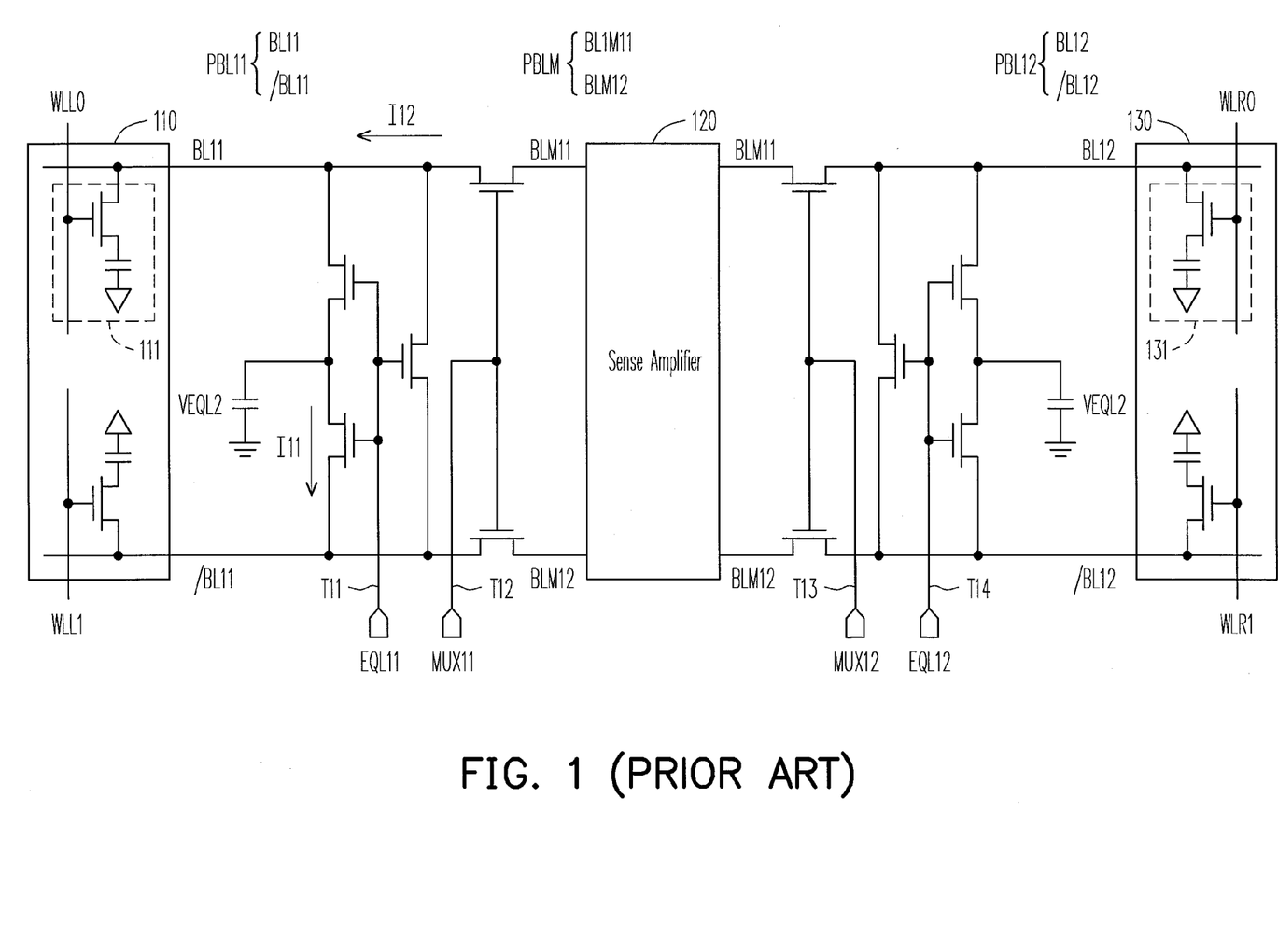
FIG. 1 illustrates a structure of a basic unit of a conventional DRAM.
Figure 2:
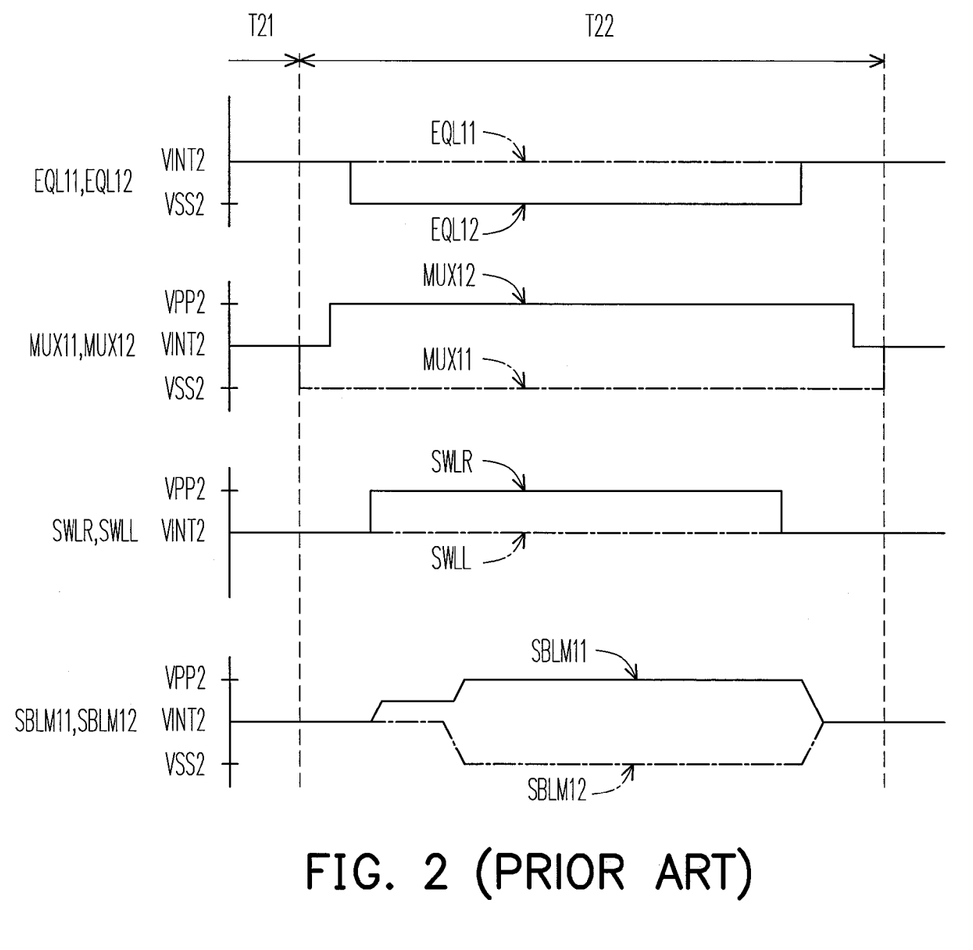
FIG. 2 illustrates a timing diagram of various signals of FIG. 1.

DRAM is a type of memory that is being most widely used. The DRAM stores data using capacitors and, because charges in the capacitors gradually disappear, additional periodic refreshing operations are required. FIG. 1 illustrates a structure of a basic unit of a conventional DRAM. FIG. 2 illustrates a timing diagram of various signals of FIG. 1. Referring to FIGS. 1 and 2, during an equalization period T21, because the level of signals EQL11, EQL12, MUX11 and MUX12 is maintained at a voltage VINT2, bit lines (BL11, /BL12, BL12 and /BL12) and sense lines (BLM11 and BLM12) are electrically coupled to each other and have a potential equal to a reference voltage VEQL2 wherein the level of the reference voltage VEQL12 is set as a half of a highest level of the bit line VBLH2.

Afterwards, in order to refresh a memory cell 131 coupled to a word line WLR0, a memory cell array 130 is enabled during a refreshing period T22. At this time, the level of the signals EQL12 and MUX11 is switched to a voltage VSS2, such that the bit lines BL12 and /BL12 are not conducted to each other, and a sense amplifier 120 and a memory cell array 110 are not electrically coupled to each other. Next, the word line WLR0 is used to address the memory cell to be accessed. During a signal generating stage, the memory cell 131 is turned on and the signals to be read are generated on the bit lines BL12, /BL12 and the sense lines BLM11, BLM12. At this time, the sense amplifier 120 amplifies the signals on the sense lines BLM11, BLM12, thereby refreshing the memory cell 131.

It should be noted that continuously reducing of the DRAM core structure size would cause the problem of leakage current between the bit lines to be more and more serious. This is mainly because, during the equalization period, a parasitic capacitor in the memory cell forms an undesired conducting path such that a leakage current, for example, as indicated by I11 in FIG. 1, is generated between the bit lines. This problem can be mitigated by adding a current limiter. However, the leakage current arising from the sense amplifier 120, for example, as indicated by I12 in FIG. 1, cannot be suppressed.

Figure 3:
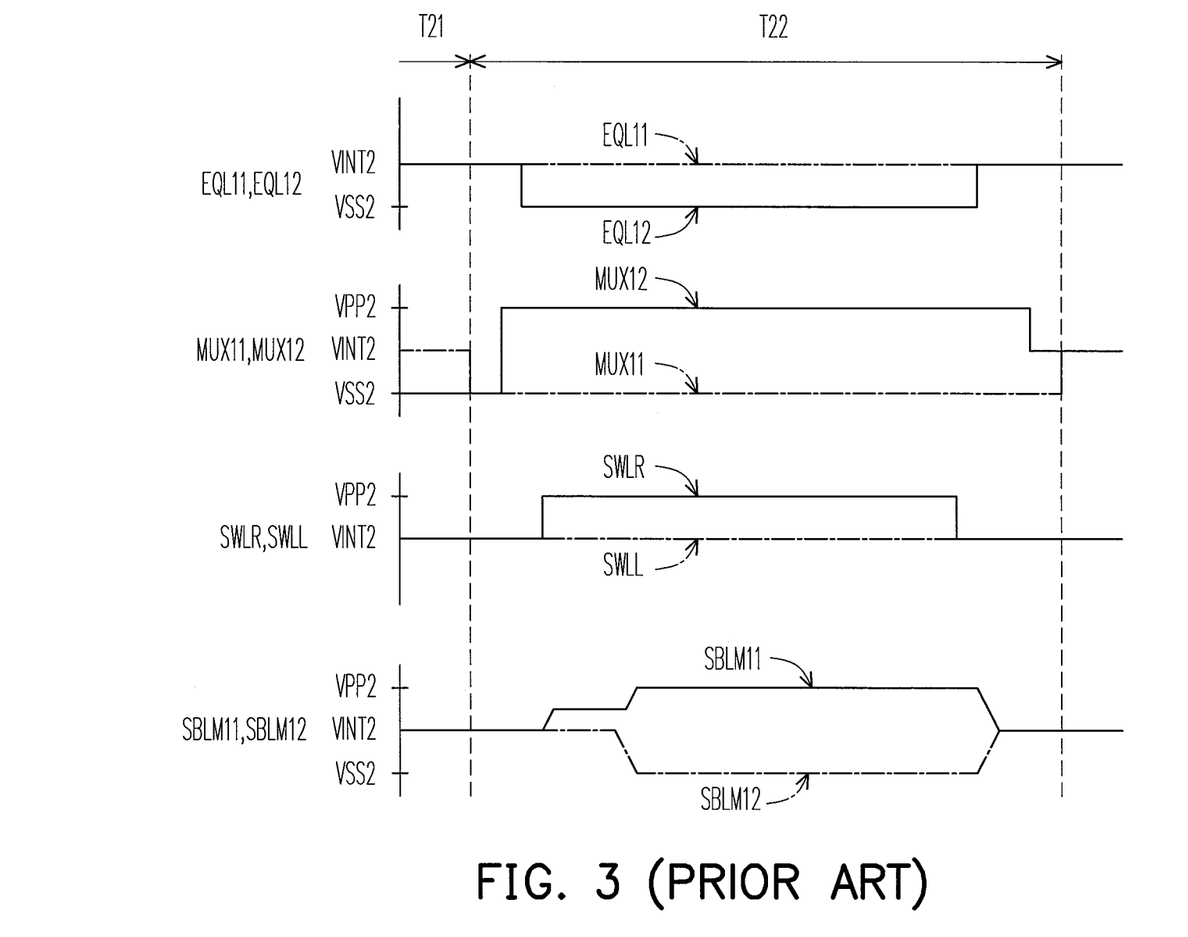
FIG. 3 illustrates another timing diagram of the signals of FIG. 1.

In order to prevent the leakage current arising from the sense amplifier 120, as shown in FIG. 3, at an initial stage of the refreshing period T22, the signals MUX11 and MUX12 are conventionally switched to the voltage VSS2 at the same time. At this time, the sense lines BLM11 and BLM12 are maintained in a floating state, thereby reducing the possibility of generating the leakage current. However, when the sense lines BLM11 and BLM12 are maintained in the floating state at the same time, noise may be generated which would affect a noise margin of the entire system.

SUMMARY OF THE INVENTION

Accordingly, the present invention is directed to a refreshing method for reducing the generation of leakage current and noise in a memory device.

The present invention provides a refreshing method suitable for a memory device. The memory device includes a sense amplifier, a first memory cell array and a second memory cell array. The sense amplifier includes a sense line pair and is used to amplify signals from a first bit line pair of the first memory cell array and signals from a second bit line pair of the second memory cell array. The refreshing method includes the following steps. Firstly, a sleep mode is set and the memory device cannot be read and programmed in the sleep mode. Then, the first and the second memory cell arrays are sequentially auto-refreshed.

It should be noted that the step of auto-refreshing each of the first memory cell array and the second memory cell array includes: during an equalization period, switching a potential of the sense line pair, the first bit line pair and the second bit line pair to a reference voltage wherein the sense line pair and the second bit line pair are not electrically coupled to each other; and during a refreshing period, adjusting the potential of the first and the second bit line pairs according to a refresh sequence of the first and the second memory cell arrays, thereby electrically coupling the sense line pair to at least one of the first and the second bit line pairs.

According to one embodiment of the present invention, the step of switching the potential of the sense line pair, the first bit line pair and the second bit line pair to the reference voltage during the equalization period includes providing a first and a second equalized control signals to control a conducting state between two bit lines of the first bit line pair and a conducting state between two bit lines of the second bit line pair, respectively. A first and a second sense control signals are then provided to control a conducting state between the sense line pair and the first bit line pair and a conducting state between the sense line pair and the second bit line pair, respectively.

Further, in order to switch the level of each bit line pair to the reference voltage, the level of the first and the second equalized control signals is maintained at a first voltage such that the two bit lines of each of the first and the second bit line pairs are conducted to each other and have a potential equal to the reference voltage. In addition, the level of the first sense control signal is maintained at the first voltage such that the sense line pair is electrically coupled to the first bit line pair. At this time, the level of the second sense control signal is switched to a second voltage such that the sense line pair is not electrically coupled to the second bit line pair.

According to one embodiment of the present invention, the step of during the refreshing period for auto-refreshing the second memory cell array, adjusting the potential of the first and the second bit line pairs according to the refresh sequence of the first and the second memory cell arrays includes maintaining the level of the first equalized control signal such that the two bit lines of the first bit line pair are conducted to each other and have the potential equal to the reference voltage. And, the level of the second control signal is switched to the second voltage such that the two bit lines of the second bit line pair are not electrically conducted to each other.

According to one embodiment of the present invention, the step of in auto-refreshing the second memory cell array, electrically coupling the sense line pair to at least one of the first and the second bit line pairs includes firstly switching the level of the first sense control signal to the second voltage such that the sense line pair and the first bit line pair are not electrically coupled to each other. And, the level of the second sense control signal is stepwisely increased such that the sense amplifier amplifies the signals from the second bit line pair.

In view of the foregoing, in the present invention, in auto-refreshing the first and the second memory cell arrays, the sense line pair is not electrically coupled to the second bit line pair during the equalization period, thereby reducing the leakage current between the bit lines. In addition, in the present invention, the sense line pair is electrically coupled to at least one of the first and the second bit line pairs during the refreshing period, thereby reducing noises.

In order to make the aforementioned and other features and advantages of the present invention more comprehensible, embodiments accompanied with figures are described in detail below.

DESCRIPTION OF THE EMBODIMENTS

The present invention provides a refreshing method suitable for a memory device. For ease of description, embodiments of the present invention are described in conjunction with the dynamic random access memory (DRAM) illustrated in FIG. 1.

As shown in FIG. 1, the DRAM includes memory cell arrays 110, 130 and a sense amplifier 120. The memory cell arrays 110 and 130 each includes a plurality of bit line pairs. For example, the memory cell array 110 includes a first bit line pair PBL11 consisting of bit lines BL11 and /BL11, and the memory cell array 130 includes a second bit line pair PBL12 consisting of bit lines BL12 and /BL12. The sense amplifier 120 includes a sense line pair PBLM consisting of sense lines BLM11 and BLM12, and is used to amplify signals from the bit line pairs PBL11 and PBL12. In the description below, receiving terminals T11~T14 of FIG. 1 are used to respectively receive signals EQL41, MUX41, MUX42 and EQL42 defined in the embodiment below.

Figure 4A:
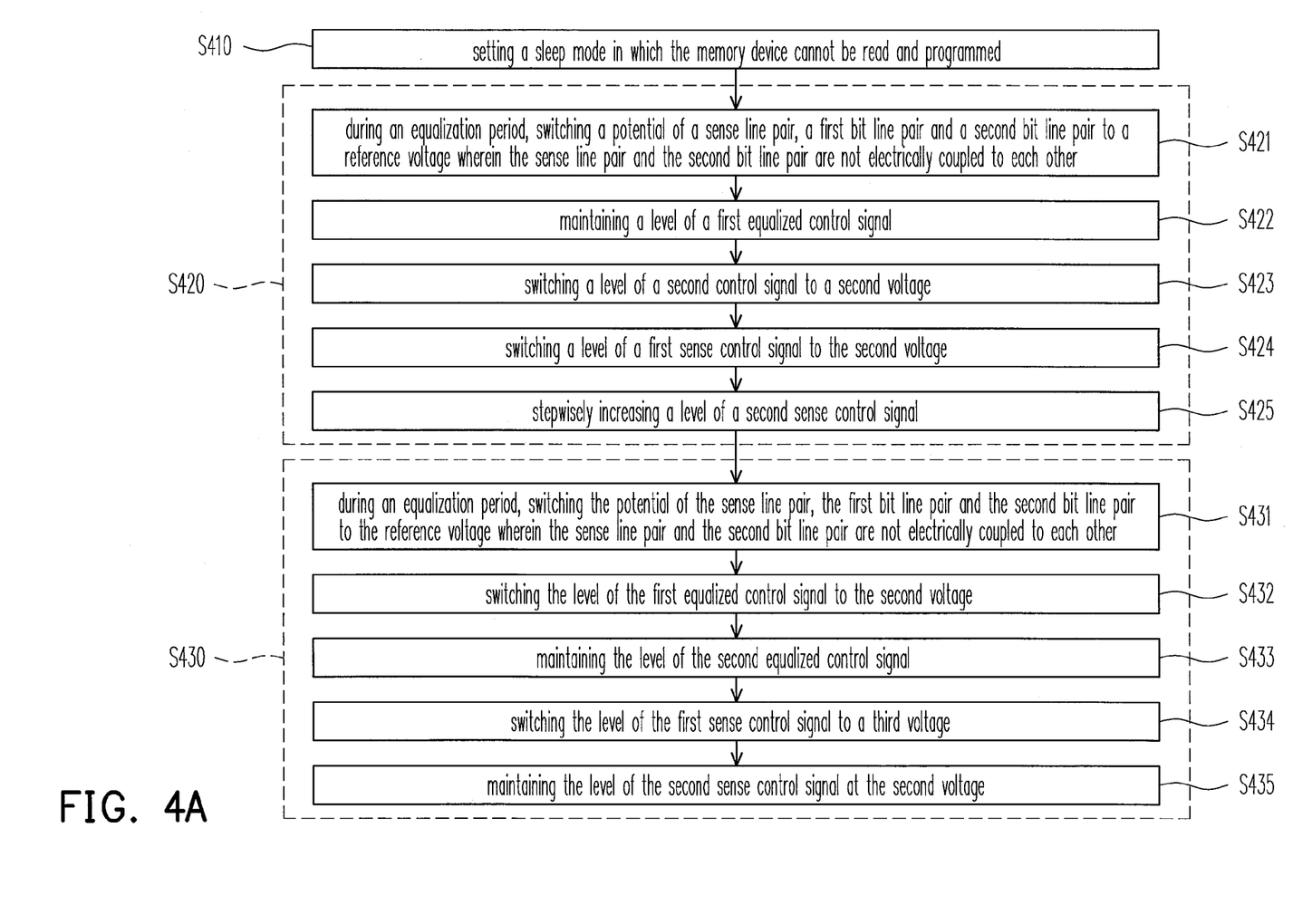
FIG. 4A illustrates a flow chart of a refreshing method according to one embodiment of the present invention.
Figure 4B:
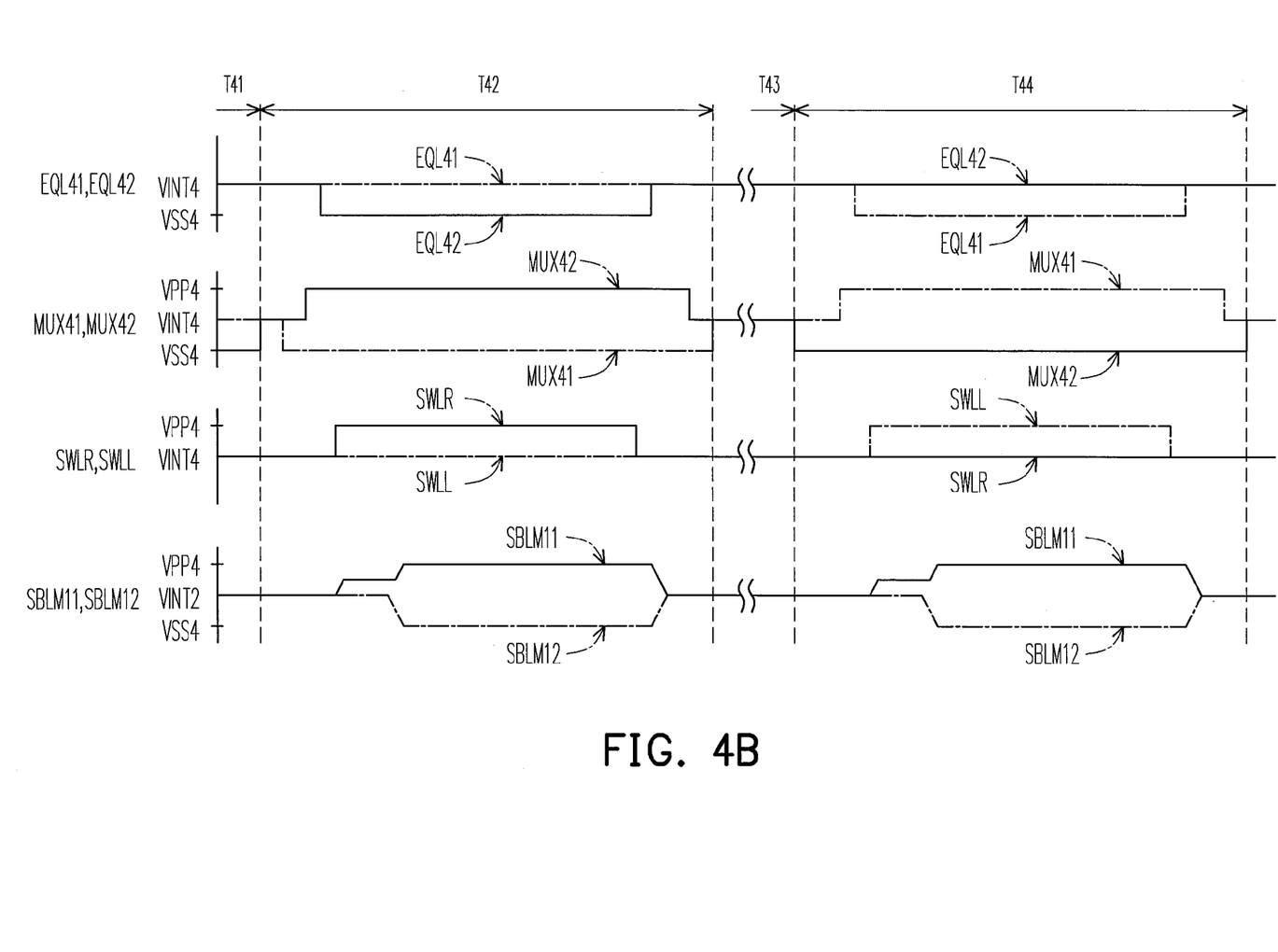
FIG. 4B illustrates a timing diagram of various signals of FIG. 4A.

FIG. 4A illustrates a flow chart of a refreshing method according to one embodiment of the present invention. FIG. 4B illustrates a timing diagram of various signals of FIG. 4A. Referring to FIGS. 1, 4A and 4B, a sleep mode is set and the memory device cannot be read and programmed in the sleep mode at step S410. For example, step S410 sets a sleep mode in which the memory cell arrays 110 and 130 cannot be read and programmed. During the sleep mode, a second memory cell array, for example, the memory cell array 130 of FIG. 1 is then auto-refreshed at step S420.

For example, as shown in FIG. 4B, in the present embodiment, the memory cell array 130 is refreshed during an equalization period T41 and a refreshing period T42. In this process, the potential of the sense line pair PBLM, the first bit line pair PBL11 and the second bit line pair PBL12 is first switched to a reference voltage VEQL2 at step S421.

Figure 5:
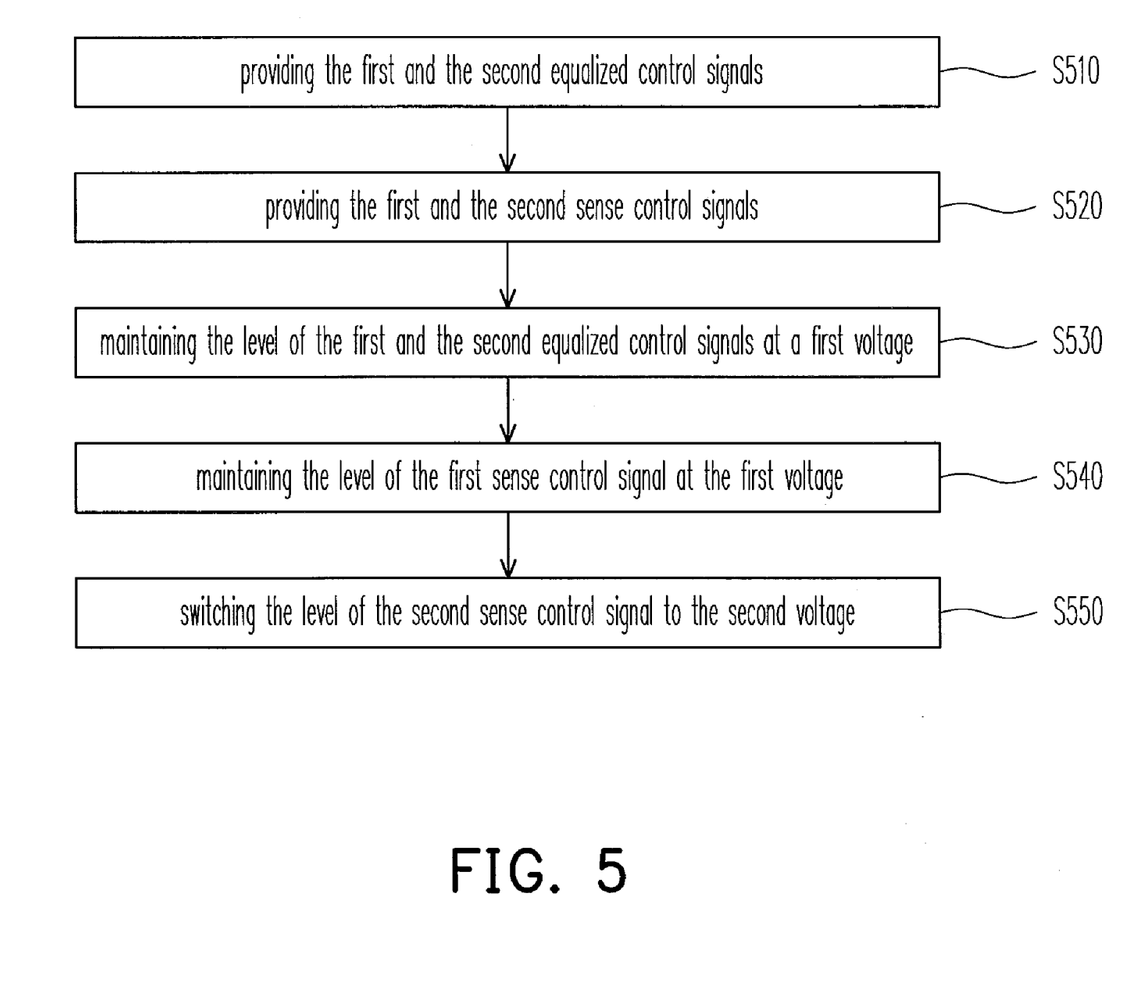
FIG. 5 illustrates a flow chart of step S421.

Referring to FIG. 5, the detail of step S421 is shown. During the equalization period T41, a first equalized control signal EQL41 and a second equalized control signal EQL42 are first provided at step S510 to control the conducting state of the two bit lines of the first bit line pair PBL11 and the second bit line pair PBL12, respectively. At step S520, a first sense control signal MUX41 and a second sense control signal MUX42 are provided to control the conducting state between the sense line pair PBLM and the first bit line pair PBL11, and the conducting state between the sense line pair PBLM and the second bit line pair PBL12, respectively.

Afterwards, at step S530, the level of the first equalized control signal EQL41 and the second equalized control signal EQL42 is maintained at a first voltage VINT4. At this time, the two bit lines BL11 and /BL11 of the first bit line pair PBL11 are conducted to each other and have a potential equal to the reference voltage VEQL2. Similarly, the two bit lines BL12 and /BL12 of the second bit line pair PBL12 are also conducted to each other and have a potential equal to the reference voltage VEQL2.

Next, at step S540, the level of the first sense control signal MUX41 is maintained at the first voltage VINT4. At this time, the sensor line pair PMLM is electrically coupled to the first bit line pair PBL11 and has a potential equal to the reference voltage VEQL2. On the other hand, the level of the second sense control signal MUX42 is switched to a second voltage VSS4 at step S550. As such, the sense line pair PMLM and the second bit line pair PBL12 are not electrically coupled to each other, thereby facilitating reducing the leakage current between the bit lines.

With continuous reference to FIG. 4A, after the level of the sense line pair PBLM, the first bit line pair PBL11 and the second bit line pair PBL12 is switched to the reference voltage during the equalization period T41, the memory cell array 130 is refreshed through the steps S422~S425 during the refreshing period T42. More specifically, during the refreshing period T42, the level of the first equalized control signal EQL41 is maintained at step S422. As such, the first equalized control signal EQL41 is maintained at the first voltage VINT4, such that the two bit lines BL41 and /BL41 of the first bit line pair PBL11 are electrically conducted to each other and have a potential equal to the reference voltage VEQL2.

Afterwards, at step S433, the level of the second equalized control signal EQL12 is switched to the second voltage VSS4. At this time, the two bit lines BL12 and /BL12 of the second bit line pair PBL12 are not electrically conducted to each other and, therefore, can be used to transmit signals from the memory cell array 130, respectively. Next, at step S424, the level of the first sense control signal MUX41 is switched to the second voltage VSS4, such that the sense line pair PBLM and the first bit line pair PBL11 are not electrically coupled to each other. On the other hand, the level of the second sense control signal MUX42 is increased stepwisely at step S425.

At this time, the level of the second sense control signal MUX42 is switched from the second voltage VSS4 to the first voltage VINT4, and subsequently from the first voltage VINT4 to a third voltage VPP4. The third voltage VPP4 is higher than the first voltage VINT4, the first voltage VINT4 is higher than the second voltage VSS4, and the second voltage VSS4 is, for example, a ground voltage of the system. As such, the conducting path between the sense line pair PBLM and the second bit line pair PBL12 is ensured, which enables the sense amplifier 120 to amplify the signal from the second bit line pair PBL12.

It should be noted that, during a signal generating stage, memory cells (e.g., a memory cell 131) coupled to the second bit line pair PBL12 are turned on in response to a signal SWLR transmitted through word lines WLR0 and WLR1. At this time, signals from the memory cells coupled to the second bit line pair PBL12 are generated on the bit lines BL12, /BL12 and the sense lines BLM11, BLM12, and are amplified through the sense amplifier 120, thereby obtaining signals SBLM11 and SBLM12 during the refreshing period T42.

With continuous reference to FIG. 4A, after the auto-refresh of the second memory array (i.e., the memory cell array 130) is completed, a first memory cell array (i.e., the memory cell array 110) is auto-refreshed at step S430.

For example, as shown in FIG. 4B, in the present embodiment, the memory cell array 110 is refreshed during an equalization period T43 and a refreshing period T44. During this process, the potential of the sense line pair PBLM, the first bit line pair PBL11 and the second bit line pair PBL11 is first switched to a reference voltage VEQL2 at step S431 during the equi-level period T43. The detail of the step S431 is substantially the same as the detail of the step S421 and is therefore not repeated herein.

Next, the memory cell array 110 is refreshed through steps S432~S435 during the refreshing period T44. More specifically, during the refreshing period T44, the level of the first equalized control signal EQL41 is switched to the second voltage VSS4 at step S432, such that the two bit lines BL11 and /BL11 of the first bit line pair PBL11 are not conducted to each other. Afterwards, at step S433, the level of the second equi-level signal EQL42 is maintained, such that the two bit lines BL12 and /BL12 of the second bit line pair are conducted to each other and have a potential equal to the reference voltage VEQL2.

Next, at step S434, the level of the first sense control signal MUX41 is switched to the third voltage VPP4, which enables the sense amplifier 120 to amplify signals from the first bit line pair PBL11. At step S435, the level of the second sense control signal MUX42 is maintained at the second voltage VSS4, such that the sense line pair PBLM and the second bit line pair PBL12 are not electrically coupled to each other.

Similarly, during the signal generating stage, memory cells (e.g., a memory cell 111) coupled to the first bit line pair PBL11 are turned on in response to a signal SWLL transmitted through word lines WLL0 and WLL1. At this time, signals from the memory cells coupled to the first bit line pair PBL11 are generated on the bit lines BL11, /BL11 and the sense lines BLM11, BLM12, and are amplified through the sense amplifier 120, thereby obtaining signals SBLM11 and SBLM12 during the refreshing period T44.

In summary, the processes of auto-refreshing each of the first and the second memory cell array includes an equalization period and a refreshing period. In addition, in the present embodiment, no matter whether to refresh the first memory cell array or the second memory cell array, the potential of the sense line pair, the first bit line pair and the second bit line pair is switched to the reference voltage during the equalization period, thereby reducing the leakage current between the bit lines. On the other hand, in the present invention, the potential of the first bit line pair and the second bit line pair are adjusted according to a refresh sequence of the first and the second memory cell arrays, such that the sense line pair electrically coupled with at least one of the first and the second bit line pairs. As such, the two sense lines of the sense line pair would not be in a floating state at the same time during the refreshing period, thereby reducing noises.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A refreshing method suitable for a memory device comprising a sense amplifier, a first memory cell array and a second memory cell array, the sense amplifier comprising a sense line pair and adapted to amplify signals from a first bit line pair of the first memory cell array and signals from a second bit line pair of the second memory cell array, the refreshing method comprising:
   setting a sleep mode in which the memory device cannot be read and programmed; and
   sequentially auto-refreshing the first and the second memory cell arrays during the sleep mode, wherein the step of auto-refreshing each of the first memory cell array and the second memory cell array comprises:
   during an equalization period, switching a potential of the sense line pair, the first bit line pair and the second bit line pair to a reference voltage wherein the sense line pair and the second bit line pair are not electrically coupled to each other, wherein the step of switching the potential of the sense line pair, the first bit line pair and the second bit line pair to the reference voltage during the equalization period comprises:
   providing a first and a second equalized control signals to control a conducting state between two bit lines of the first bit line pair and a conducting state between two bit lines of the second bit line pair, respectively;
   providing a first and a second sense control signals to control a conducting state between the sense line pair and the first bit line pair and a conducting state between the sense line pair and the second bit line pair, respectively;
   maintaining the level of the first and the second equalized control signals at a first voltage such that the two bit lines of each of the first and the second bit line pairs are conducted to each other and have a potential equal to the reference voltage;
   maintaining the level of the first sense control signal at the first voltage such that the sense line pair is electrically coupled to the first bit line pair; and
   switching the level of the second sense control signal to a second voltage such that the sense line pair is not electrically coupled to the second bit line pair; and
   during a refreshing period, adjusting the potential of the first and the second bit line pairs according to a refresh sequence of the first and the second memory cell arrays, thereby electrically coupling the sense line pair to at least one of the first and the second bit line pairs, wherein the step of in auto-refreshing the second memory cell array, electrically coupling the sense line pair to at least one of the first and the second bit line pairs comprises:
   switching the level of the first sense control signal to the second voltage such that the sense line pair and the first bit line pair are not electrically coupled to each other; and
   stepwisely increasing the level of the second sense control signal such that the sense amplifier amplifies the signals from the second bit line pair, wherein the step of stepwisely increasing the level of the second sense control signal comprises:
   switching the level of the second sense control signal from the second voltage to the first voltage; and
   switching the level of the second sense control signal from the first voltage to a third voltage wherein the third voltage is higher than the first voltage and the first voltage is higher than the second voltage.

2. The refreshing method according to claim 1, wherein the step of during the refreshing period for auto-refreshing the second memory cell array, adjusting the potential of the first and the second bit line pairs according to the refresh sequence of the first and the second memory cell arrays comprises:

maintaining the level of the first equalized control signal such that the two bit lines of the first bit line pair are conducted to each other and have the potential equal to the reference voltage; and switching the level of the second equalized control signal to the second voltage such that the two bit lines of the second bit line pair are not electrically conducted to each other.

3. The refreshing method according to claim 1, wherein the step of during the refreshing period for auto-refreshing the first memory cell array, adjusting the potential of the first and the second bit line pairs according to the refresh sequence of the first and the second memory cell arrays comprises:

switching the level of the first equalized control signal to the second voltage such that the two bit lines of the first bit line pair are not electrically conducted to each other; and maintaining the level of the second equalized control signal such that the two bit lines of the second bit line pair are electrically conducted to each other and have the potential equal to the reference voltage.

4. The refreshing method according to claim 1, wherein the step of in auto-refreshing the first memory cell array, electrically coupling the sense line pair to at least one of the first and the second bit line pairs comprises:

switching the level of the first sense control signal to a third voltage such that the sense amplifier amplifies the signals from the first bit line pair; and maintaining the level of the second sense control signal at the second voltage such that the sense line pair and the second bit line pair are not electrically coupled to each other wherein the third voltage is higher than the first voltage and the first voltage is higher than the second voltage.

5. The refreshing method according to claim 1, wherein the second voltage is a ground voltage.

6. The refreshing method according to claim 1, wherein the memory device is a dynamic random access memory.

* * * * *